(12) United States Patent
Pooley et al.

(10) Patent No.: US 11,882,771 B2
(45) Date of Patent: Jan. 23, 2024

(54) SMOOTH METAL LAYERS IN JOSEPHSON JUNCTION DEVICES

(71) Applicant: International Business Machines Corporation, Armonk, NY (US)

(72) Inventors: Kathryn Jessica Pooley, Croton on Hudson, NY (US); Hongwen Yan, Somers, NY (US); Gerald W. Gibson, Danbury, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 120 days.

(21) Appl. No.: 17/503,701

(22) Filed: Oct. 18, 2021

(65) Prior Publication Data
US 2023/0117764 A1 Apr. 20, 2023

(51) Int. Cl.
*H10N 60/01* (2023.01)
*H10N 60/80* (2023.01)

(52) U.S. Cl.
CPC ..... *H10N 60/0912* (2023.02); *H10N 60/0884* (2023.02); *H10N 60/805* (2023.02); *H10N 60/0241* (2023.02)

(58) Field of Classification Search
CPC ........... H10N 60/0912; H10N 60/0884; H10N 60/805; H10N 60/0241
See application file for complete search history.

(56) References Cited

U.S. PATENT DOCUMENTS

| | | | |
|---|---|---|---|
| 4,966,885 A | | 10/1990 | Hebard |
| 5,055,158 A | * | 10/1991 | Gallagher .......... H10N 60/0912 505/820 |
| 6,059,872 A | | 5/2000 | Ngan et al. |
| 6,149,777 A | | 11/2000 | Ngan et al. |
| 2018/0138389 A1 | * | 5/2018 | Kirby ................. H10N 60/0156 |
| 2020/0144114 A1 | * | 5/2020 | Wagner .............. H10N 60/0156 |

FOREIGN PATENT DOCUMENTS

JP H06112155 A 4/1994

OTHER PUBLICATIONS

Lau et al. AIP Advances 4, 027120 (2014); https://doi.org/10.1063/1.4866988 (Year: 2014).*
Chen, Wei-Chun, et al. | Heteroepitaxial growth of TiN film on MgO (100) by reactive magnetron sputtering. Nanoscale Research Letters 2014, 9:551, 5 pages.

(Continued)

*Primary Examiner* — Matthew L Reames
(74) *Attorney, Agent, or Firm* — Amin, Turocy & Watson, LLP

(57) ABSTRACT

Techniques and methods to form smooth metal layers deposited onto selected surfaces of Josephson junction devices are provided. For example, one or more embodiments described herein can comprise depositing a layer of a first material comprising metal atom species on a selected surface of a device layer; depositing a layer of a second material on a surface of the layer of first material; and performing plasma etching on the layer of second material and the layer of first material to form an etched surface of the layer of first material that is smoother than the surface of the layer of first material, as deposited.

18 Claims, 6 Drawing Sheets

(56) References Cited

OTHER PUBLICATIONS

Du, J. et al. | Influence of Nb film surface morphology on the sub-gap leakage characteristics of Nb/AlOx-—Al/Nb Josephson junctions. Supercond. Sci. Technol. 20 (2007, pp. 350-355.
Sun Rui, et al. | Fabrication of (200)-Oriented TIN Films on Si (100) Substrates by DC Magnetron Sputtering. IEEE Transactions on Applied Superconductivity, vol. 25, No. 3, Jun. 2015, 4 pages.

* cited by examiner

SMOOTH METAL LAYERS IN JOSEPHSON JUNCTION DEVICES

BACKGROUND

The subject disclosure relates generally to Josephson junction devices and, more specifically, to methods to facilitate forming of smooth metal layers employed in the fabrication of the Josephson junction devices.

SUMMARY

The following presents a summary to provide a basic understanding of one or more embodiments of the invention. This summary is not intended to identify key or critical elements, or to delineate any scope of the particular embodiments, or any scope of the claims. Its sole purpose is to present concepts in a simplified form as a prelude to the more detailed description that is presented later. In one or more embodiments described herein, systems, apparatuses, and/or methods to form a smooth metal layer within a Josephson junction circuit are described.

According to an embodiment, a method is provided. The method can comprise depositing a layer of a first material comprising metal atom species on a selected surface of a device layer. The method can also comprise depositing a layer of a second material on a surface of the layer of first material. The method can further comprise performing plasma etching on the layer of second material and the layer of first material to form an etched surface of the layer of first material that is smoother than the surface of the layer of first material, as deposited.

According to another embodiment, a method is provided. The method can comprise adjacently coupling a layer of first material to a selected surface of a device layer. The method can also comprise adjacently coupling a layer of second material to the layer of first material. The method can further comprise performing plasma etching on the layer of second material and the layer of first material to form an etched surface of the layer of first material that is smoother than the surface of the layer of first material as deposited layer.

DETAILED DESCRIPTION

Figure 1:
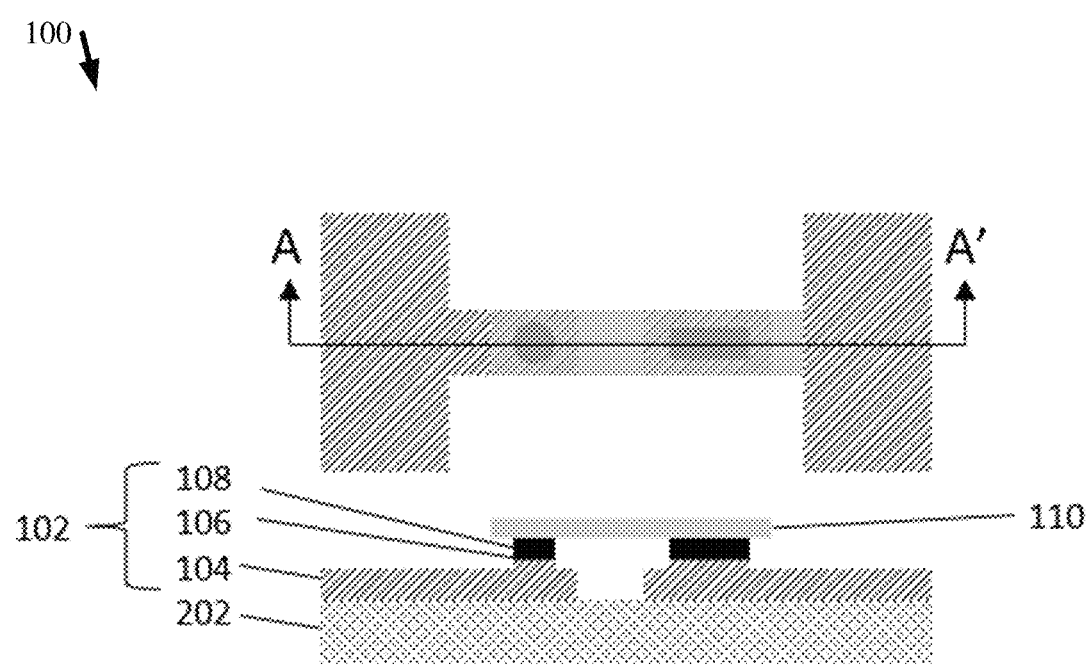
FIG. 1 illustrates an exemplary diagram of a non-limiting cross-sectional view of a Josephson junction-based circuit structure, in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. Additionally, features depicted in the drawings with like shading, cross-hatching, and/or coloring can comprise shared compositions and/or materials. It will be understood that when an element as a layer (also referred sometimes as a film), region, and/or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. It will also be understood that when an element is referred to as being "coupled" to another element, it can describe one or more different types of coupling including, but not limited to, chemical coupling, communicative coupling, electrical coupling, electromagnetic coupling, operative coupling, optical coupling, physical coupling, thermal coupling, and/or another type of coupling.

As described herein, the terms "deposition process" and/or "deposition processes" can refer to any process that grows, coats, deposits, and/or otherwise transfers one or more first materials on one or more second materials. Example deposition processes can include, but are not limited to: physical vapor deposition ("PVD"), chemical vaper deposition ("CVD"), electrochemical deposition ("ECD"), atomic layer deposition ("ALD"), pulse laser deposition ("PLD"), low-pressure chemical vapor deposition ("LPCVD"), plasma enhanced chemical vapor deposition ("PECVD"), high density plasma chemical vapor deposition ("HDPCVD"), sub-atmospheric chemical vapor deposition ("SACVD"), rapid thermal chemical vapor deposition ("RTCVD"), in-situ radical assisted deposition, high temperature oxide deposition ("HTO"), low temperature oxide deposition ("LTO"), limited reaction processing CVD ("LRPCVD"), ultrahigh vacuum chemical vapor deposition ("UHVCVD"), metalorganic chemical vapor deposition ("MOCVD"), physical vapor deposition ("PVD"), chemical oxidation, sputtering, plating, evaporation, spin-on-coating, ion beam deposition, electron beam deposition, laser assisted deposition, chemical solution deposition, a combination thereof, and/or the like.

As described herein, the terms "etching process", "etching process", "removal process", and/or "removal processes" can refer to any process that removes one or more first materials from one or more second materials. Example etching and/or removal processes can include, but are not limited to, wet etching, dry etching (e.g., reactive ion etching ("RIE")), chemical-mechanical planarization ("CMP"), a combination thereof, and/or the like.

As described herein, the term "ion-deposition sputtered" and the term "ion metal plasma" (IMP) can refer to a particular technique for sputter deposition, for example magnetron sputter deposition (where a magnet array is placed behind the target). In a greater exemplary detail, a high density, inductively coupled RF plasma is positioned between the sputtering cathode and the substrate support electrode, whereby at least a portion of the sputtered emission is in the form of ions at the time it reaches the substrate surface. The term "reactive ion deposition" or "reactive ion metal plasma (IMP)" refers to ion-deposition sputtering wherein a reactive gas is supplied during the sputtering to react with the ionized material being sputtered, producing an ion-deposition sputtered compound containing the reactive gas element.

As described herein, the terms "lithography process" and/or "lithography processes" can refer to the formation of three-dimensional relief images or patterns on a substrate for subsequent transfer of the pattern to the substrate. For example, the patterns can be formed by a light sensitive polymer called a photoresist. To build the complex structures that make up a semiconductor device and the many wires that connect the various features of a circuit, lithography processes and/or etch pattern transfer steps can be repeated multiple times. Each pattern being printed on the wafer can be aligned to the previously formed patterns and slowly the subject features (e.g., conductors, insulators and/or selectively doped regions) can be built up to form the final device.

As described herein, the term "AFM" (Atomic Force Microscope) refers to an exemplary technique used to measure film surface roughness, wherein a microprobe in contact with the film surface is drawn across the film and the mechanical movement of the microprobe is translated to a digital signal which is plotted out. A series of plots is further compiled, and a surface roughness is then calculated from the compilation.

In one example, superconducting qubits can include one or more Josephson junctions, which can achieve the Josephson tunneling effect by having two or more superconducting electrodes coupled through an intermediate region where the superconducting order parameter is suppressed. Thereby, the intermediate region can constitute a link between the superconductors. The link can be formed from an insulator (e.g., thereby forming a superconductor-insulator-superconductor ("SIS") Josephson junction), a normal metal (e.g., thereby forming a superconductor-normal metal-superconductor ("SNS") Josephson junction), and/or a constriction between the superconductors (e.g., thereby forming a superconductor-constriction-superconductor "SCS") Josephson junction).

FIG. 1 illustrates an exemplary diagram of a non-limiting cross-sectional view of a Josephson junction-based circuit, in accordance with one or more embodiments described herein. The construct of a Josephson junction-based circuit 100, which is analogous, in some embodiments, to the gate and first-level interconnect in a complementary metal-oxide-semiconductor (CMOS) circuit, is shown in FIG. 1. In various embodiments, a Josephson junction 102 is deposited as a series of successive layers, a base electrode layer 104, a tunnel barrier layer 106, and a counter electrode layer 108 on top of a device layer 202, such as, for example, a silicon or semiconductor wafer. The deposited Josephson junction 102 is further referred to herein as a Josephson junction layer stack, which will be described in great detail below in connection with FIGS. 2A, 2B, 3A-C, and 4. Furthermore, in various embodiments, the counter electrode layer 108 is subtractively patterned to define the Josephson junction 102, such as, for example, as a step analogous to a gate etch process in a CMOS circuit. Next, the base electrode layer 104 is patterned to define a first level of wiring for the Josephson junction-based circuit 100. Following the base electrode layer 104 patterning, an interlevel dielectric, such as, for example, a low temperature silicon dioxide, is deposited and polished back utilizing CMP to expose the tops of the counter electrodes. Next, a superconducting interconnect metal layer 110 is then deposited and patterned to complete the interconnections of the Josephson junction-based circuit 100. In various embodiments, additional wiring levels can be added to create more complex circuits.

Figure 2A:
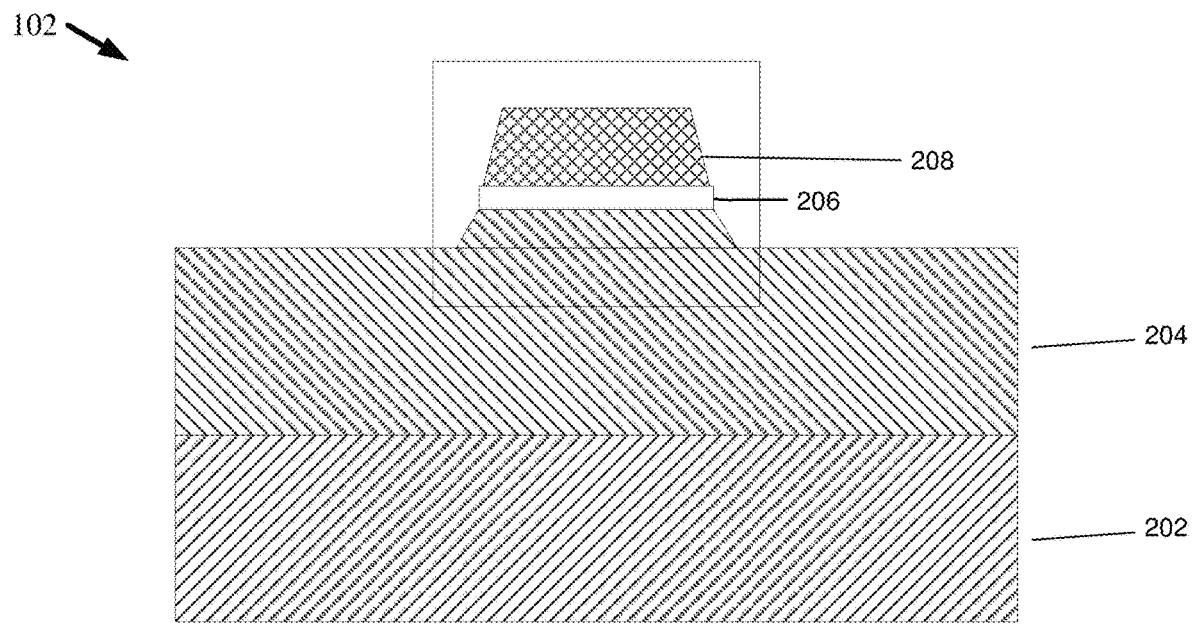
FIG. 2A illustrates an exemplary diagram of a non-limiting cross-sectional view of a device comprising a Josephson junction layer stack that can be formed in accordance with one or more embodiments described herein.
Figure 2B:
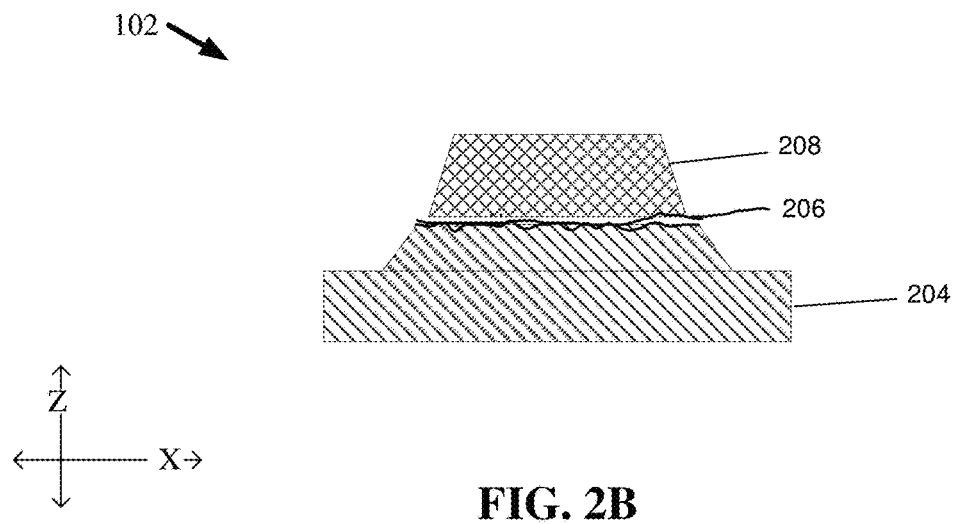
FIG. 2B illustrates an exemplary detailed diagram of a Josephson junction layer stack that comprises a nonuniform barrier layer due to surface roughness of the underlying layer.

FIG. 2A illustrates a general cross-sectional view of a Josephson junction layer stack 102 that can be formed in accordance with one or embodiment described herein. FIG. 2B illustrates a detailed cross-sectional view of a Josephson junction layer stack 102 and its various sublayers that has a nonuniform barrier layer due to surface roughness of the underlying layer, which can be mitigated as described in further detail below.

In various embodiments, the Josephson junction layer stack 102 includes a device layer 202, such as, for example, a silicon or semiconductor wafer. The device layer 202 has a selected top surface adjacently coupled to a layer 204 of first material, comprising in some instances a metal atom species. The layer 204 of first material, which comprises a metal atom species, is deposited on the selected top surface. The layer 204 may comprise, e.g., a metal nitride, such as, for example, titanium nitride (TiN) or niobium nitride (NbN), or alternatively, a metal such as niobium (Nb). In various embodiments, the layer 204 of first material is a thin layer having a rough surface morphology in its as-deposited form, such as, for example, a columnar grain structure. In some instances, high-density regions within a thin layer may tend to grow in parallel columns. These columns may develop when the surface mobility of adsorbed atoms is relatively low and their growth direction is not necessarily perpendicular to the substrate surface, such as, for example, the selected surface of the device layer 202, although it can be perpendicular for depositing layer materials arriving at normal incidence. In various embodiments, the layer 204 of first material can be deposited using one of several deposition processes, such as, for example, an IMP process. In various embodiments, a layer 204 of first material, for example titanium nitride (TiN), niobium nitride (NbN), and/or other metal nitride, or niobium (Nb), can be employed as part of a conductive stack of materials, such as, for example, the Josephson junction layer stack 102.

In various embodiments, a rough top surface of the layer 204 of first material, in its as-deposited form, can lead to non-uniformity of a tunnel barrier layer of a Josephson junction that is deposited on the layer 204. Such non-uniformity of the tunnel barrier layer can lead to non-optimal device performance, such as, for example, sub-gap leakage or poorly controlled critical current, because the rough surface of the layer 204 of first material can cause a tunnel barrier grown on such surface to be non-planar and/or of non-uniform thickness. In various embodiments, as will be discussed further below, in order to mitigate this effect, a layer 206 of thin (e.g., 5-10 nanometers) second material, such as, for example, aluminum (Al) and/or aluminum oxide (AlOx), may be deposited on the layer 204 of first material and then etched back into the layer 204, thereby providing a smoother etched surface of the layer 204 on which to deposit a tunnel barrier layer with good uniformity.

In various embodiments, the Josephson junction layer stack 102 may include other layers, such as, for example, another TiN or NbN layer 208 deposited on a uniform tunnel barrier layer. Various embodiments of a method to form a smooth surface for the layer 204 on which to form a uniform tunnel barrier layer are further described in detail below in connection to FIGS. 3A-C.

Figure 3A:
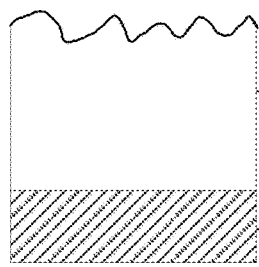
FIGS. 3A-C illustrate exemplary diagrams of non-limiting simplified cross-sectional views of the Josephson junction layer stack during a method to facilitate forming of a smooth layer of first material comprising a metal atom species within the Josephson junction layer stack, in accordance with one or more embodiments described herein.
Figure 3B:
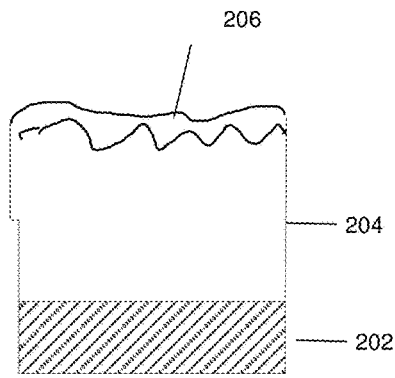
Figure 3C:
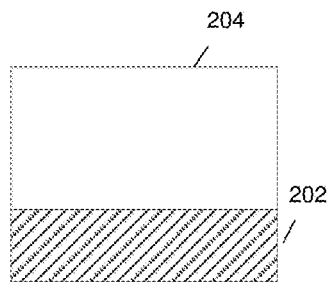

FIGS. 3A-C illustrate exemplary diagrams of non-limiting simplified cross-sectional views of the Josephson junction layer stack during a method to facilitate forming of a smooth layer of first material comprising a metal atom species within the Josephson junction layer stack, in accordance with one or more embodiments described herein. Repetitive description of like elements employed in other embodiments described herein is omitted for sake of brevity. As shown in FIG. 3A, a layer 204 of first material, such as an exemplary TiN layer, can be deposited on a selected top surface of a device layer 202 through one of several deposition processes, such as, for example, the IMP process. As shown in FIG. 3A, the as-deposited surface of layer 204 of first material has surface roughness, which can depend on the conditions under which the layer 204 is formed. For example, a layer 204 of TiN material, of about 215 nanometers in (nm) thickness, may have a roughness coefficient Rmax of about 13.0 nm.

As shown in FIG. 3B, a layer 206 of second material, such as, for example, a thin layer of aluminum (Al) and/or AlOx, or other exemplary material, can be deposited on the rough surface of the layer 204 of first material, using known deposition processes. This second material can be chosen such that its as-deposited surface morphology is smoother than that of the underlying layer 204 of first material, e.g., Al and/or AlOx deposited by PVD, or CVD, or spin-on techniques.

In various embodiments, a plasma etching process can then be performed on the layer 206 of second material and on the layer 204 of first material situated adjacently underneath the layer 206. In this regard, the layer 206 of second material, which has a smoother surface than the underlying layer 204 of first material, is a sacrificial layer that is etched away in a uniform fashion, so as to promote a uniform etch into the underlying layer 204 of first material. In this way, the etching of layer 204 of first material can achieve a smoother etched surface of the layer 204 than the as-deposited surface of layer 204, as illustrated in FIG. 3C. For example, a typical TiN layer etching process can use at least one of: an argon/chlorine mixture (Ar/Cl$_2$), an argon/boron trichloride mixture (Ar/BCl$_3$), or either of these gas mixtures with addition of nitrogen (N$_2$) gas as a diluent. In various embodiments, these etch chemistries and the layer materials are chosen to etch the layer 206 of second material and the layer 204 of first material at approximately the same rate (e.g., etch rates for the layer 206 of second material and the layer 204 of first material being within 10% of one another.) As noted above, in some embodiments, a combination of chemical etching and physical etching processes (e.g., physical sputtering techniques) may be used to achieve the desired smooth surface of the layer 204 of first material. While exemplary first materials, such as TiN and NbN, for the layer 204 and exemplary second materials Al and/or AlOx have been noted for the layer 206, the method is not restricted to these materials, thus other material combinations may be chosen depending on the desired application, provided that the etch rates of the layer 206 of second material and the layer 204 of first material are approximately the same. For example, the layer 204 of first material may be a layer that contains a metal atom species, such a metal or metal nitride or combination thereof, and the layer 206 of second material may be a metal or a metal oxide or combination thereof.

Figure 4:
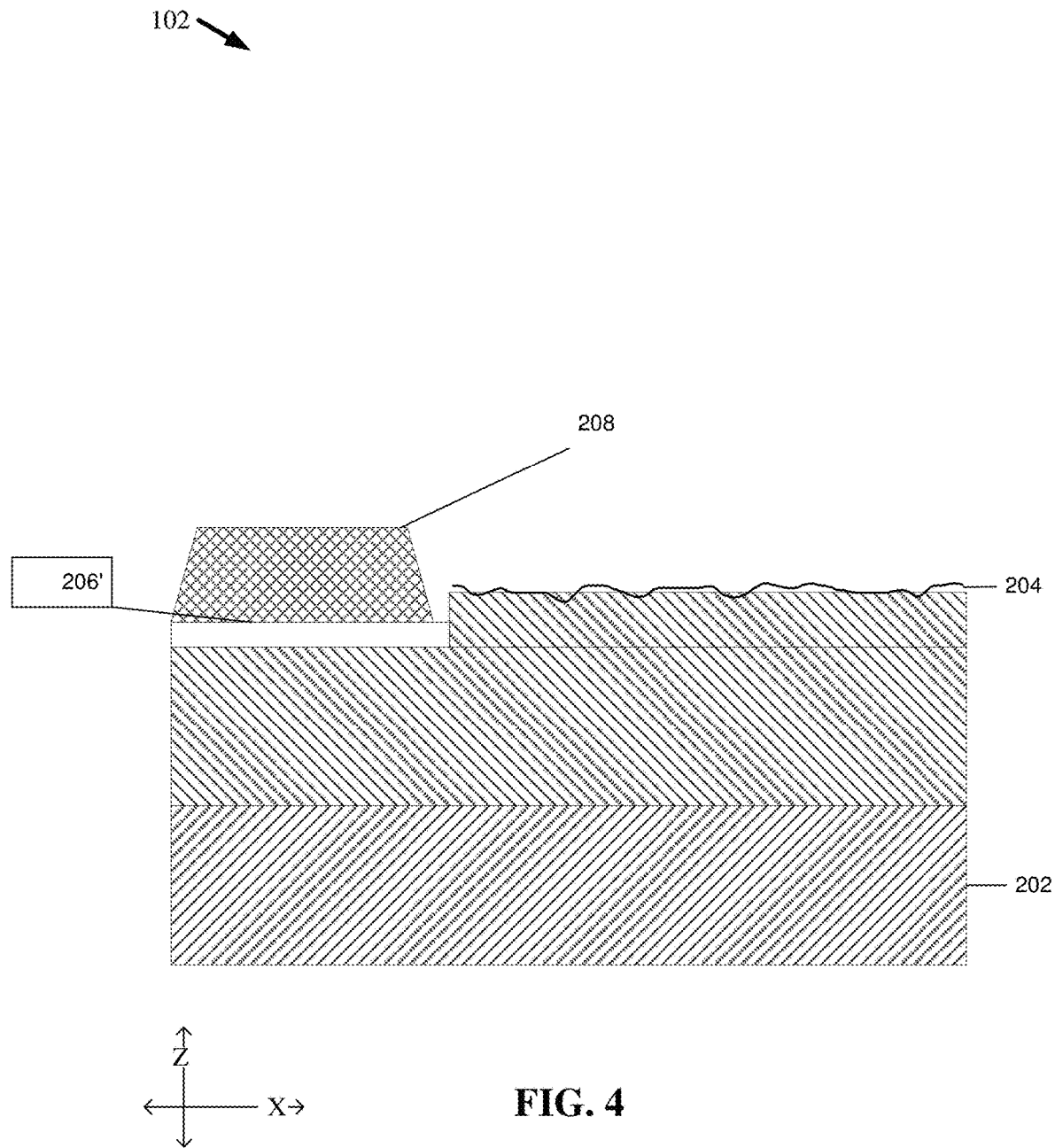
FIG. 4 illustrates an exemplary diagram of a non-limiting cross-sectional view of a Josephson junction layer stack showing at least one smooth area of a layer of first material comprising a metal atom species and a uniform barrier layer, in accordance with one or more embodiments described herein.

FIG. 4 illustrates an exemplary diagram of a non-limiting cross-sectional view of a Josephson junction layer stack showing at least one smooth area of a layer of first material comprising a metal atom species and a uniform barrier layer, in accordance with one or more embodiments described herein. As shown in FIG. 4, in some embodiments, the surface smoothing method described in greater detail above may be used to selectively form smooth layer area 402 (e.g., as a bottom layer of a Josephson junction stack, such as stack 102), while one or more other areas of the layer 204 of first material need not have undergone the smoothing process described with reference to FIGS. 3A-3C. In this regard, for example, layer 204 in FIG. 4 can be comprised of a first material such as TiN, NbN, or another exemplary material like Nb. Layer 206 can be, for example, comprised of a second material such as a uniform AlOx layer deposited on the smooth layer area 402 of layer 204. And layer 208 can be TiN, NbN, or another material to complete the layer stack, e.g., the Josephson junction stack. Suitable lithographic patterning in combination with etching such as described above can be utilized to selectively pattern various regions of the device structure.

Figure 5:
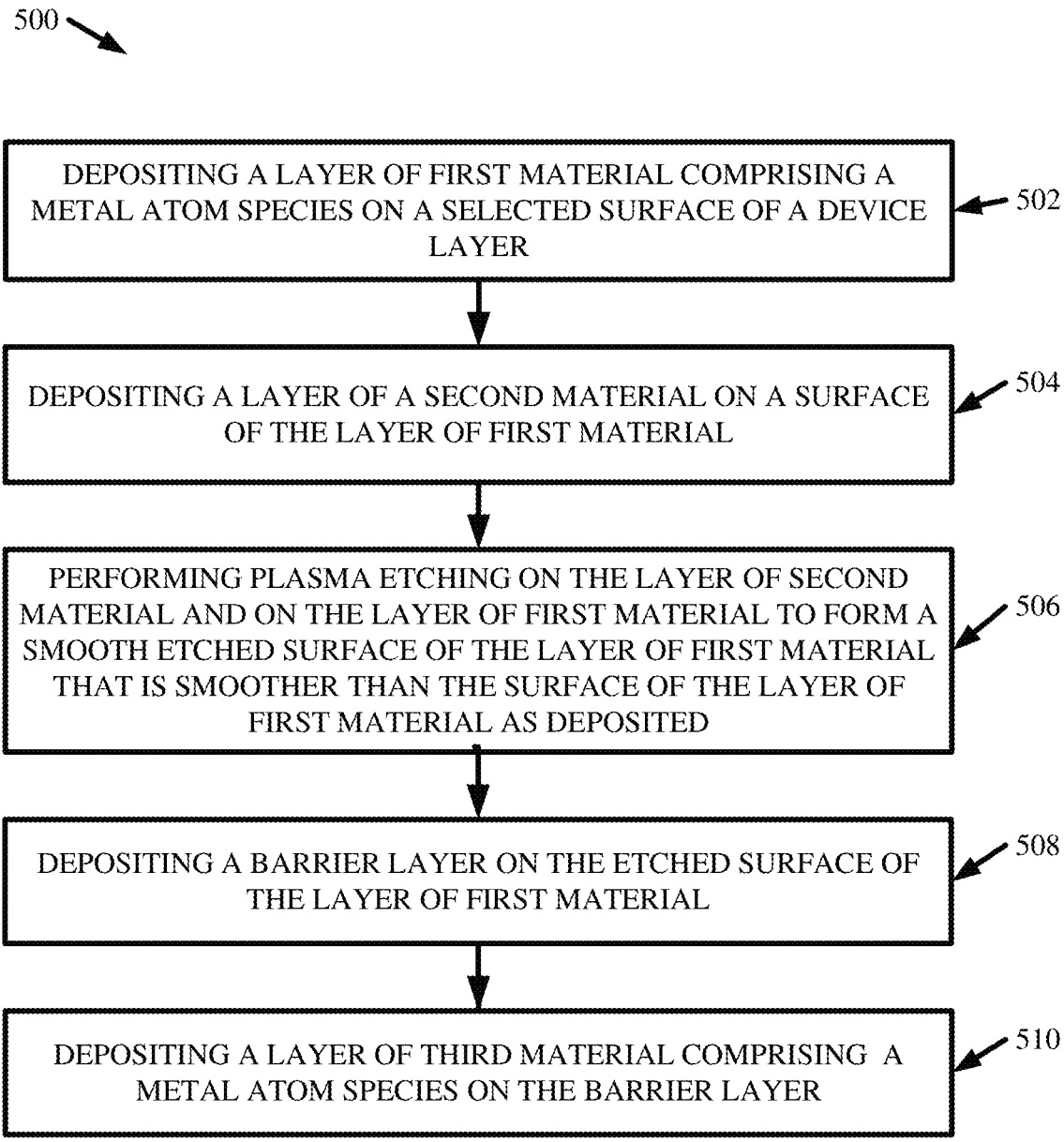
FIG. 5 illustrates a flow diagram of an exemplary, non-limiting method to facilitate forming of a smooth layer of first material comprising metal atom species within the Josephson junction layer stack, in accordance with one or more embodiments described herein.

FIG. 5 illustrates a flow diagram of an exemplary, non-limiting method to facilitate forming of a smooth layer of first material comprising metal atom species within the Josephson junction layer stack, in accordance with one or more embodiments described herein. Repetitive description of like elements employed in other embodiments described herein is omitted for sake of brevity.

As illustrated in FIG. 5, at 502, the method 500 may comprise depositing a layer (e.g., layer 204) of a first material comprising a metal atom species on a selected surface of a device layer that subsequently becomes a circuit. As described in various embodiments herein, the layer 204 of first material can be deposited on a selected surface of a device layer 202, such as, for example a silicon or semiconductor wafer, via one or more deposition processes and can comprise one or more materials, such as, for example, TiN, NbN, other metal nitride, or other material. By way of example, but not limitation, 502 can be performed by physical vapor deposition (PVD) to deposit the TiN first material.

At 504, the method 500 can comprise depositing a layer of a second material (e.g., layer 206) on the layer of first material. As described in various embodiments herein, the layer 206 of second material can be deposited on the layer 204 of first material via one or more deposition processes and/or can comprise one or more materials such as, for example, a metal layer or dielectric layer. By way of example, but not limitation, 504 can be performed by PVD to deposit Al or by chemical vapor deposition (CVD) to deposit AlOx.

At 506, the method 500 can comprise performing plasma etching on the layer 206 of second material and the layer 204 of first material to form a smooth etched surface on a selected portion of the layer 204 of first material. In this regard, the etched surface of the layer of first material 204 is smoother (has lower surface roughness) than the as-deposited surface of the layer 204 of first material. As described in various embodiments herein, one of several plasma etching processes, or a combination process of chemical and physical etching, is performed on the layer 206 of second material and on the layer 204 of first material to achieve a smooth etched surface on the layer 204 of first material. The layer 206 of second material is etched away in this exemplary approach, and so the layer 206 may be considered a sacrificial layer in this regard. In one or more embodiments, the depositing and forming at 502-506 can be facilitated by one or more deposition processes and/or lithography processes. At 508, a barrier layer may be deposited on the etched surface of the layer 204 of first material or, alternatively, a thin film of material, such as aluminum, may be deposited on the etched surface of the layer 204, then the barrier layer may subsequently be deposited on the thin film of material. The barrier layer may be, e.g., a tunnel barrier layer of a Josephson junction, and can be, e.g., AlOx or other suitable tunnel barrier layer. At 510, a layer of third material comprising a metal atom species may be deposited on the barrier layer to form a layer stack. For example, the third material layer can comprise, e.g., TiN, NbN, other metal nitride or other material, and the layer stack can be a layer stack of a Josephson junction, such as illustrated in FIG. 1.

Figure 6:
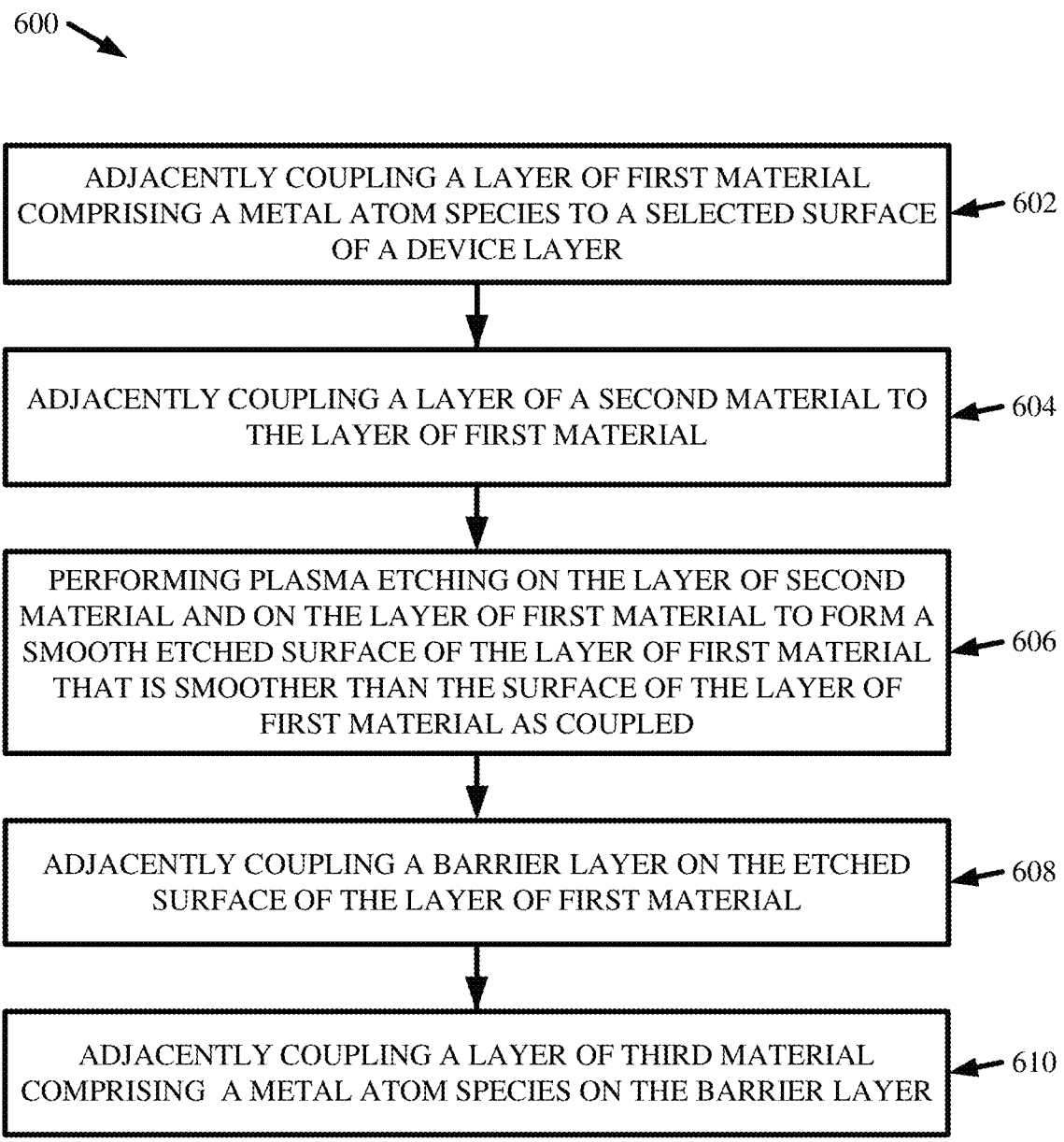
FIG. 6 illustrates a flow diagram of an exemplary, non-limiting alternate method for manufacturing a smooth layer of first material comprising metal atom species in a device, in accordance with one or more embodiments described herein.

FIG. 6 illustrates a flow diagram of another exemplary, non-limiting method 600 for manufacturing a smooth layer of first material comprising metal atom species in a device, in accordance with one or more embodiments described herein. Repetitive description of like elements employed in other embodiments described herein is omitted for sake of brevity.

As illustrated in FIG. 6, at 602, the method 600 may comprise adjacently coupling a layer (e.g., layer 204) of first material comprising a metal atom species to a selected surface of a device layer that subsequently becomes a circuit. As described in various embodiments herein, the layer 204 of first material can be adjacently coupled to a selected surface of a device layer 202, such as, for example a silicon or semiconductor wafer, via one or more deposition processes and can comprise one or more materials, such as, for example, TiN, NbN, other metal nitride, or other material. By way of example, but not limitation, 602 can be performed by physical vapor deposition (PVD) to deposit the TiN first material.

At 604, the method 600 can comprise adjacently coupling a layer 206 of second material to the layer 204 of first material. As described in various embodiments herein, the layer 206 of second material can be adjacently coupled to the layer 204 of first material via one or more deposition processes and/or can comprise one or more materials such as, for example, a metal layer or metal oxide layer (e.g., Al, AlOx, and/or Al/AlOx).

At 606, the method 600 can comprise performing plasma etching on the layer 206 of second material and the layer 204 of first material to form a smooth etched surface on a selected portion of the layer 204 of first material. In this regard, the etched surface of the layer of first material 204 is smoother (has lower surface roughness) than the as-deposited surface of the layer 204 of first material. As described in various embodiments herein, one of several plasma etching processes, or a combination process of chemical and physical etching, is performed on the layer 206 of second material and on the layer 204 of first material to achieve a smooth etched surface on the layer 204 of first material. The layer 206 of second material is etched away in this exemplary approach, and so the layer 206 may be considered a sacrificial layer in this regard. In one or more embodiments, the depositing and forming at 602-606 can be facilitated by one or more deposition processes and/or lithography processes. At step 608, a barrier layer may be adjacently coupled to the etched surface of the layer of first material layer 204, e.g., by a deposition process or, alternatively, a thin film of material, such as aluminum, may be adjacently coupled to the etched surface of the layer 204, then the barrier layer may subsequently be adjacently coupled to the thin film of material. The barrier layer may be, e.g., a tunnel barrier layer of a Josephson junction, and can be, e.g., AlOx or other suitable tunnel barrier layer. At step 610, a layer of third material comprising a metal atom species may be deposited on the barrier layer to form a layer stack. For example, the third material layer can comprise, e.g., TiN, NbN, other metal nitride or other material, and the layer stack can be a layer stack of a Josephson junction, such as illustrated in FIG. 1.

It is, of course, not practical to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

What is claimed is:

1. A method for fabricating a device structure, comprising:
   depositing a layer of a first material comprising metal atom species on a selected surface of a device layer;
   depositing a layer of a second material on a surface of the layer of first material; and performing plasma etching on the layer of second material and the layer of first material to form an etched surface of the layer of first material wherein the etched surface of the layer of first material is smoother than the initially deposited surface of the layer of first material deposited on the selected surface of the device layer, wherein the smoother layer of the first material after the plasma etching has lower surface roughness than the initially deposited surface of the layer of first material on the selected surface of the device layer, wherein the plasma etching process employs at least one of: an argon/chlorine mixture ($Ar/Cl_2$), an argon/boron trichloride mixture ($Ar/BCl_3$), or either one of the $Ar/Cl_2$ or the $Ar/BCl_3$ with the addition of a nitrogen ($N_2$) diluent gas.

2. The method of claim 1, wherein depositing the layer of second material comprises depositing at least one of a metal layer or a dielectric layer on the layer of first material.

3. The method of claim 1, wherein the layer of first material comprises titanium nitride (TiN).

4. The method of claim 1, wherein depositing the layer of first material further comprises depositing the layer of first material on the selected surface of the device layer using an ionized metal plasma (IMP) process.

5. The method of claim 1, wherein performing the plasma etching comprises employing an etching rate which is about the same for the layer of first material and the layer of second material deposited on the layer of first material.

6. The method of claim 1, wherein the depositing the layer of the first material comprising metal atom species on the selected surface of the device layer comprises depositing the layer of the first material comprising metal atom species on the selected surface of a Josephson junction device.

7. The method of claim 1, wherein the layer of first material comprises niobium nitride (NbN).

8. The method of claim 7, wherein depositing the layer of first material comprises depositing the layer of first material on the selected surface of the device layer using an ionized metal plasma (IMP) process.

9. The method of claim 1, comprising depositing a barrier layer on the etched surface of the layer of first material, and depositing a layer of third material comprising a metal atom species on the barrier layer.

10. The method of claim 1, wherein the layer of first material comprises a metal nitride and the layer of second material comprises a metal oxide.

11. The method of claim 10, wherein the layer of second material comprises aluminum oxide (AlOx).

12. A method for fabricating a smooth layer in a device, the method comprising:
    adjacently coupling a layer of first material to a selected surface of a device layer;
    adjacently coupling a layer of second material to the layer of first material; and
    performing plasma etching on the layer of second material and the layer of first material to form an etched surface of the layer of first material, wherein the etched surface of the layer of first material is smoother than the initially deposited surface of the layer of first material adjacently coupled to the selected surface of the device layer, wherein the smoother layer of the first material after the plasma etching has less surface roughness than the initially deposited surface of the layer of first material on the selected surface of the device layer, wherein the plasma etching process employs at least one of: an argon/chlorine mixture ($Ar/Cl_2$), an argon/boron trichloride mixture ($Ar/BCl_3$), or either one of the $Ar/Cl_2$ or the $Ar/BCl_3$ with the addition of a nitrogen ($N_2$) diluent gas.

13. The method of claim 12, wherein adjacently coupling the layer of second material to the layer of first material further comprises adjacently coupling at least one of a metal layer or a dielectric layer on the layer of first material.

14. The method of claim 12, wherein the layer of first material comprises titanium nitride (TiN).

15. The method of claim 12, wherein the layer of first material comprises niobium (Nb).

16. The method of claim 12, wherein adjacently coupling the layer of first material to the selected surface of the device layer comprises adjacently coupling the layer of first material to the surface of the device layer using an ionized metal plasma (IMP) process.

17. The method of claim 12, wherein the layer of first material comprises a metal nitride and the layer of second material comprises a metal oxide.

18. The method of claim 12, comprising adjacently coupling a barrier layer to the etched surface of the layer of first material, and adjacently coupling a layer of third material comprising a metal atom species to the barrier layer.

* * * * *